US009369318B2

(12) United States Patent
Lee et al.

(10) Patent No.: US 9,369,318 B2
(45) Date of Patent: Jun. 14, 2016

(54) SCALABLE SERIAL/DE-SERIAL I/O FOR CHIP-TO-CHIP CONNECTION BASED ON MULTI-FREQUENCY QAM SCHEME (71) Applicant: THE REGENTS OF THE UNIVERSITY OF CALIFORNIA, Oakland, CA (US)

(72) Inventors: Sheau Jiung Lee, Saratoga, CA (US); Mau-Chung Frank Chang, Los Angeles, CA (US); Yanghyo Kim, Los Angeles, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 0 days.

(21) Appl. No.: 14/704,653

(22) Filed: May 5, 2015

(65) Prior Publication Data
US 2015/0312070 A1 Oct. 29, 2015

Related U.S. Application Data (63) Continuation of application No. PCT/US2013/066190, filed on Oct. 22, 2013.

(60) Provisional application No. 61/723,282, filed on Nov. 6, 2012.

(51) Int. Cl.
H04L 25/00 (2006.01)
H04L 27/00 (2006.01)
H03M 9/00 (2006.01)
H04L 27/36 (2006.01)
H04L 27/38 (2006.01)

(52) U.S. Cl.
CPC .............. *H04L 27/0002* (2013.01); *H03M 9/00* (2013.01); *H04L 27/362* (2013.01); *H04L 27/38* (2013.01)

(58) Field of Classification Search
CPC .................. H04L 25/0272; H04L 25/0292
USPC ............ 375/257, 219; 348/294, 302; 327/113
See application file for complete search history.

(56) References Cited

U.S. PATENT DOCUMENTS

| 8,989,305 B2* | 3/2015 | Choi et al. ..................... 375/296 |
| 2008/0123515 A1 | 5/2008 | Boehlke et al. |
| 2009/0058475 A1* | 3/2009 | Jung .............................. 327/113 |
| 2014/0044214 A1* | 2/2014 | Gossmann et al. ........... 375/296 |

FOREIGN PATENT DOCUMENTS

| KR | 10 2003 0049532 A | 6/2003 |
| KR | 10 2005 0040637 A | 5/2005 |
| KR | 10 2012 0062231 A | 6/2012 |

OTHER PUBLICATIONS

Korea Intellectual Property Office (KIPO), International Search Report and Written Opinion, PCT/US2013/066190, Feb. 10, 2014 (pp. 1-14) with claims searched (pp. 15-20), counterpart to U.S. Appl. No. 14/704,653 hereon.

* cited by examiner

*Primary Examiner* — Khai Tran
(74) *Attorney, Agent, or Firm* — O'Banion & Ritchey LLP; John P. O'Banion (57) ABSTRACT A serializer and de-serializer circuit which is particularly well-suited for use in communicating digital data from one integrated circuit (chip) to another for implementing chip-to-chip communications is presented. The circuits are scalable and utilize a multi-frequency quadrature amplitude modulation (QAM) mechanism for converting digital data bits from a parallel form into a serial analog stream for communication over a chip I/O connection. The serializer has multiple digital-to-analog converters (DACs) whose outputs are directed to QAM mixer inputs, within QAMs at multiple frequencies, whose outputs are summed into a single analog signal for communication over an I/O connection. The de-serializer amplifies the analog signal which is received by QAM mixers at different frequencies, whose outputs are low pass filtered and converted back to parallel digital data bits.

32 Claims, 4 Drawing Sheets

SCALABLE SERIAL/DE-SERIAL I/O FOR CHIP-TO-CHIP CONNECTION BASED ON MULTI-FREQUENCY QAM SCHEME

CROSS-REFERENCE TO RELATED APPLICATIONS

This application is a 35 U.S.C. §111(a) continuation of PCT international application number PCT/US2013/066190 filed on Oct. 22, 2013, incorporated herein by reference in its entirety, which claims priority to, and the benefit of, U.S. provisional patent application Ser. No. 61/723,282 filed on Nov. 6, 2012, incorporated herein by reference in its entirety. Priority is claimed to each of the foregoing applications.

The above-referenced PCT international application was published as PCT International Publication No. WO 2014/074300 on May 15, 2014, which publication is incorporated herein by reference in its entirety.

STATEMENT REGARDING FEDERALLY SPONSORED RESEARCH OR DEVELOPMENT

This invention was made with Government support under 0926127, awarded by the National Science Foundation. The Government has certain rights in the invention.

INCORPORATION-BY-REFERENCE OF MATERIAL SUBMITTED IN A COMPUTER PROGRAM APPENDIX

Not Applicable

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. §1.14.

BACKGROUND OF THE INVENTION

1. Field of the Invention

This invention pertains generally to chip-to-chip communications, and more particularly to a serializer and de-serializer based on quadrature amplitude modulation (QAM) at multiple frequencies.

2. Description of Related Art

Conventional serial/de-serial I/O is based on multiplexing and demultiplexing digital communications. Using these conventional schemes to increase communications bandwidth requires increasing clock rate. Because a given process technology has its own limitations on clock rates, one must often increase the number of I/O connections to increase the bandwidth, whereby the I/O bandwidth increase comes at the expense of higher manufacturing costs. These costs are even further increased in 3D integrated circuit integration, such as those based on through-substrate-via (TSV) for vertical interconnections. The number of TSVs for the I/O is non-scalable due to fundamental physical or mechanical constraints. Higher than a certain number of TSVs per unit area (or population density) leads to thinned Si substrate (about 100 μm/tier) which can result in collapse. Therefore, this thinning can seriously limit inter-tier communication bandwidth in 3D integrated circuits.

Accordingly, a need exists for chip-to-chip communication circuits having higher communication bandwidths without a concurrent need for increased clock rates or additional I/O connections. The present invention fulfills that need, and overcomes the shortcomings of previous chip-to-chip communications topologies.

BRIEF SUMMARY OF THE INVENTION

This serializer de-serializer utilizes multi-frequency band modulation (e.g., quadrature amplitude modulation (QAM)) to exchange digital data chip-to-chip (i.e., between integrated circuit devices) as an analog serial signal comprising a sum of modulated signals on multiple frequencies. Communication over an I/O connection of a first chip is performed in response to serializing the data into an analog stream, which is received at a second chip and de-serialized back to the original parallel digital data. Multiple frequency bands, such as that of QAM signaling, are utilized simultaneously over the single I/O channel to exchange data simultaneously. Such concurrent data transfer allows increasing data transfer bandwidth as more frequency band is used in a single I/O connection. The chip-to-chip interconnection can be either simplified by reducing the number of interconnection while keeping the same application bandwidth or by increasing the application bandwidth while keeping the same number of I/O connections. Using the inventive serializer de-serializer allows the user to increase communication performance, or reduce the cost of chip manufacture, or a combination thereof. The inventive chip-to-chip communication is particularly well-suited for use in advanced three dimensional chip (3DIC) integration.

Further aspects of the invention will be brought out in the following portions of the specification, wherein the detailed description is for the purpose of fully disclosing preferred embodiments of the invention without placing limitations thereon.

BRIEF DESCRIPTION OF THE SEVERAL VIEWS OF THE DRAWING(S)

The invention will be more fully understood by reference to the following drawings which are for illustrative purposes only.

DETAILED DESCRIPTION OF THE INVENTION

Figure 1:
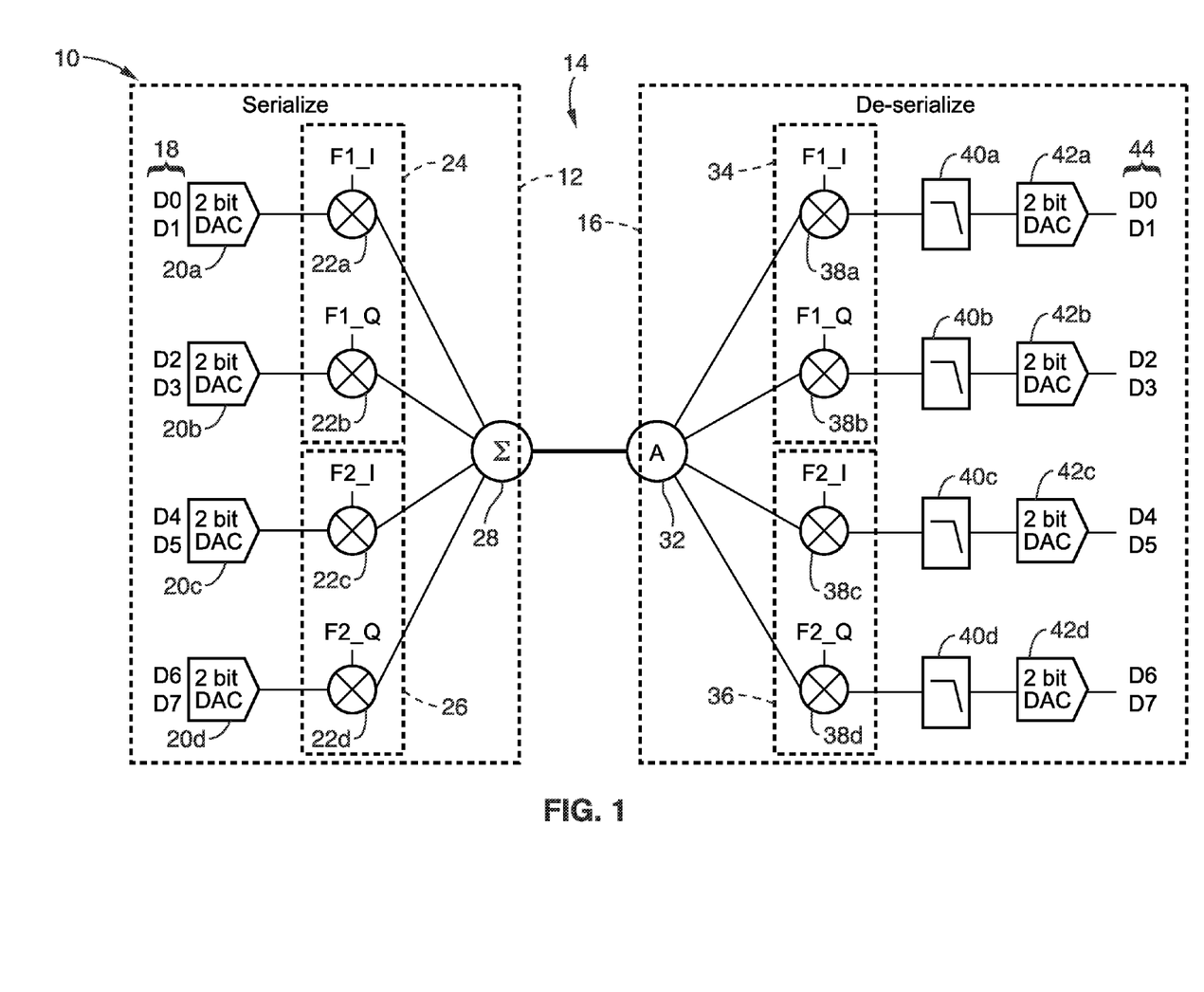
FIG. 1 is a schematic of a dual frequency QAM 16 serializer and de-serializer according to an embodiment of the present invention, shown for communicating 8 bits of digital data from a first chip to a second chip.

FIG. 1 illustrates an example embodiment 10 of chip-to-chip communications between a first chip 12 over an I/O connect 14 to a second chip 16. The chip-to-chip communication is performed by serializing parallel digital data (having N bits) onto an analog signal (sum of M analog signals) which is communicated to a second chip, where the analog signal is de-serialized back into parallel digital data. The communication in this embodiment utilizes multiple (e.g., two) frequency bands encoded with a quadrature amplitude modulation (e.g., QAM) scheme to serialize and de-serialize data through an input-output chip connection, providing chip-to-chip communications. Embodiments of the present invention can utilize more than two frequency bands into which the digital data is encoded. It should be appreciated that one of these modulation frequencies can be zero, that is DC. Using DC as one modulation frequency can reduce the number of frequency generation circuits needed, including phase-locking circuits (e.g., PLL) which are also needed. As generation of these modulation frequencies is well known with regard to analog modulation and demodulation, the circuits for generating them are not shown.

It will be appreciated that QAM, as described in this embodiment, is an analog modulation mechanism, which differs from digital multiplexing used in a digital serialization scheme. In analog QAM, two analog message signals are communicated on each frequency channel by changing (modulating) two carrier waves. The two carrier waves (typically sinusoids), are out of phase with each other by 90° and are thus called quadrature carriers. Output over a frequency channel is the sum of the modulated waves of phase modulation (PM) and amplitude modulation (AM). For the sake of simplicity of description, the internal circuitry for analog QAM is not described. It will be noted that a large number of QAM circuits are available and the technology is well known to one of ordinary skill in the art.

An 8 bit parallel input 18 is seen with bits D0 through D7, grouped with pairs of bits (i.e., D0 and D1, D2 and D3, D4 and D5, D6 and D7), with each pair of bits received by a two bit digital-to-analog converter (DAC) 20a, 20b, 20c and 20d. Each analog output from the DACs (20a, 20b, 20c and 20d) is coupled to QAM mixers. Output from DAC 20a is received at the QAM I channel at mixer 22a which also receives a 90 degree out-of-phase modulation carrier F1_I, with the output from DAC 20b coupled to the Q channel at mixer 22b, along with a 90 degree out-of-phase modulation carrier F1_Q. Mixers 22a, 22b are both associated with QAM modulator 24. Similarly, outputs from DAC 20c is coupled to mixer 22c which also receives 90 degree out-of-phase modulation carrier F2_I, while output from DAC 22d is received at mixer 22d which also receives 90 degree out-of-phase modulation carrier F2_Q. Mixers 22c, 22d are both associated with QAM modulator 26. Outputs from the mixers of both QAM modulators 24, 26 are summed at adder 28 and output over I/O connection 14 from first chip 12. Through this modulation process, the parallel input is thus serialized into a series output as an analog signal.

The analog signal over I/O connection 14 is preferably received by an amplifier 32 which provides a gain stage to compensate for loss in the low pass filter. Amplified signal 14 is coupled to mixers 38a, 38b in a first QAM demodulator 34, which receives 90 degree out-of-phase modulation carriers F1_I, F1_Q, respectively. In a second QAM demodulator 36, mixers 38c, 38d receive the amplified signal as well as 90 degree out-of-phase modulation carriers F2_I, F2_Q. Four analog signal channels are output from mixers 38a, 38b, 38c, 38d to low pass filters 40a, 40b, 40c and 40d. The low pass filters may be of any desired configuration and order (i.e., $2^{nd}$ order, $3^{rd}$ order and so forth). Output from the filters is received by two-bit analog-to-digital converters (ADC) 42a, 42b, 42c and 42d. Data 44 from each pair of bits is output from the ADCs. Through this demodulation process, the analog serial input is thus de-serialized back to a parallel digital output.

It should be appreciated that certain embodiments, for example a sufficiently low fan out or high impedance QAM mixers under low noise conditions, can be implemented without the amplifier. It should also be noted that the low pass filters can be replaced with a peak detector, without departing from the teachings of the present invention.

Accordingly, FIG. 1 illustrates an 8 bit parallel input serialized by two frequency bands of QAM16 to one I/O port for a first chip, output from which is then de-serialized at a second chip by two frequency bands of QAM16 demodulation back into the original parallel data. It should be appreciated, however, that the serializing and de-serializing according to the present invention can be implemented in a number of different ways without departing from the present invention. By way of example and not limitation, the above embodiment can be scaled up to serialize and de-serialize 16 bits of parallel data by using either four frequency bands of QAM16 or two frequency bands of QAM256, as described in the following sections.

Figure 2A:
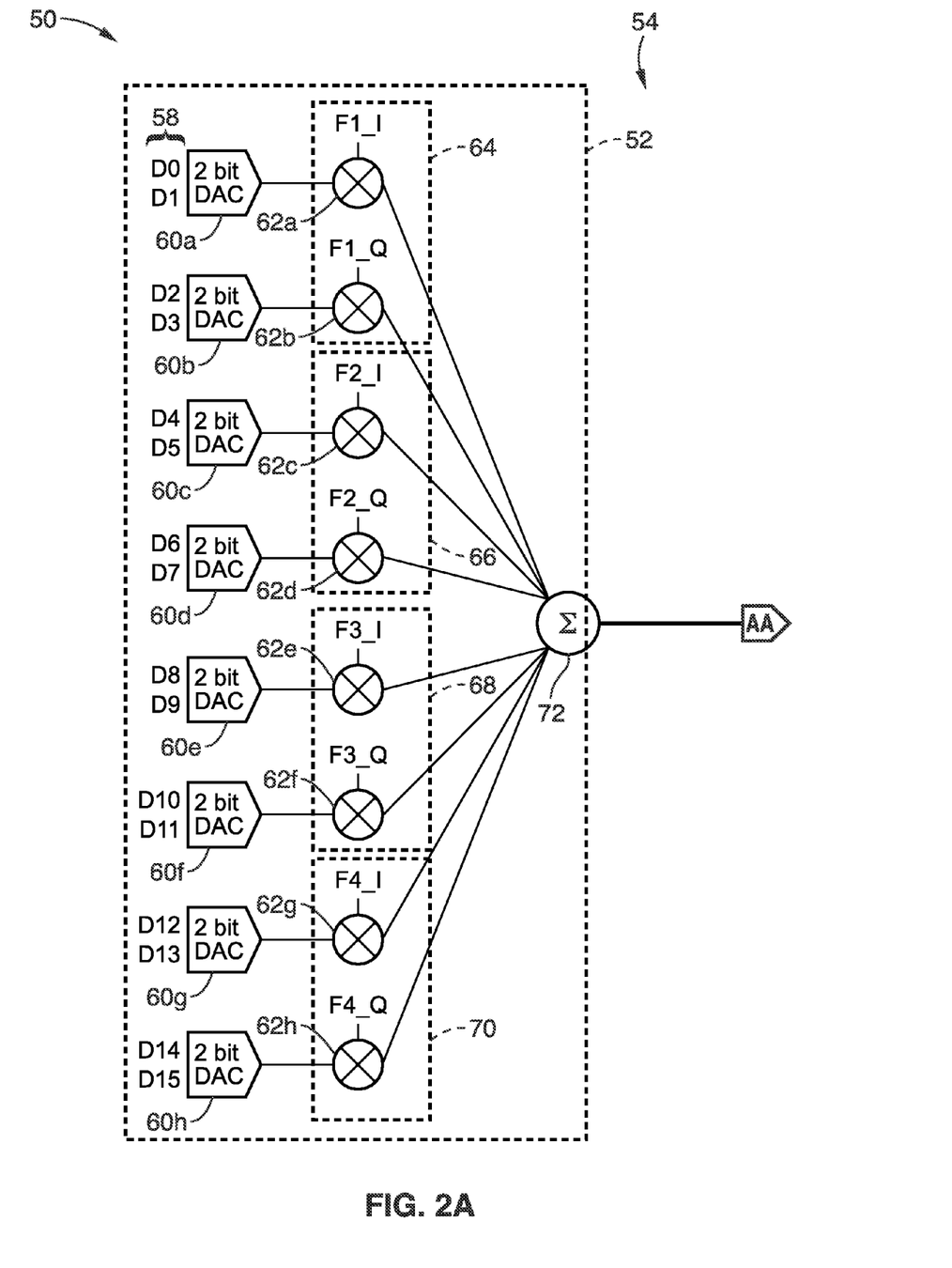
FIG. 2A and FIG. 2B are a schematic of a quad frequency QAM 16 serializer and de-serializer according to an embodiment of the present invention, shown for communicating 16 bits of digital data from a first chip to a second chip.
Figure 2B:
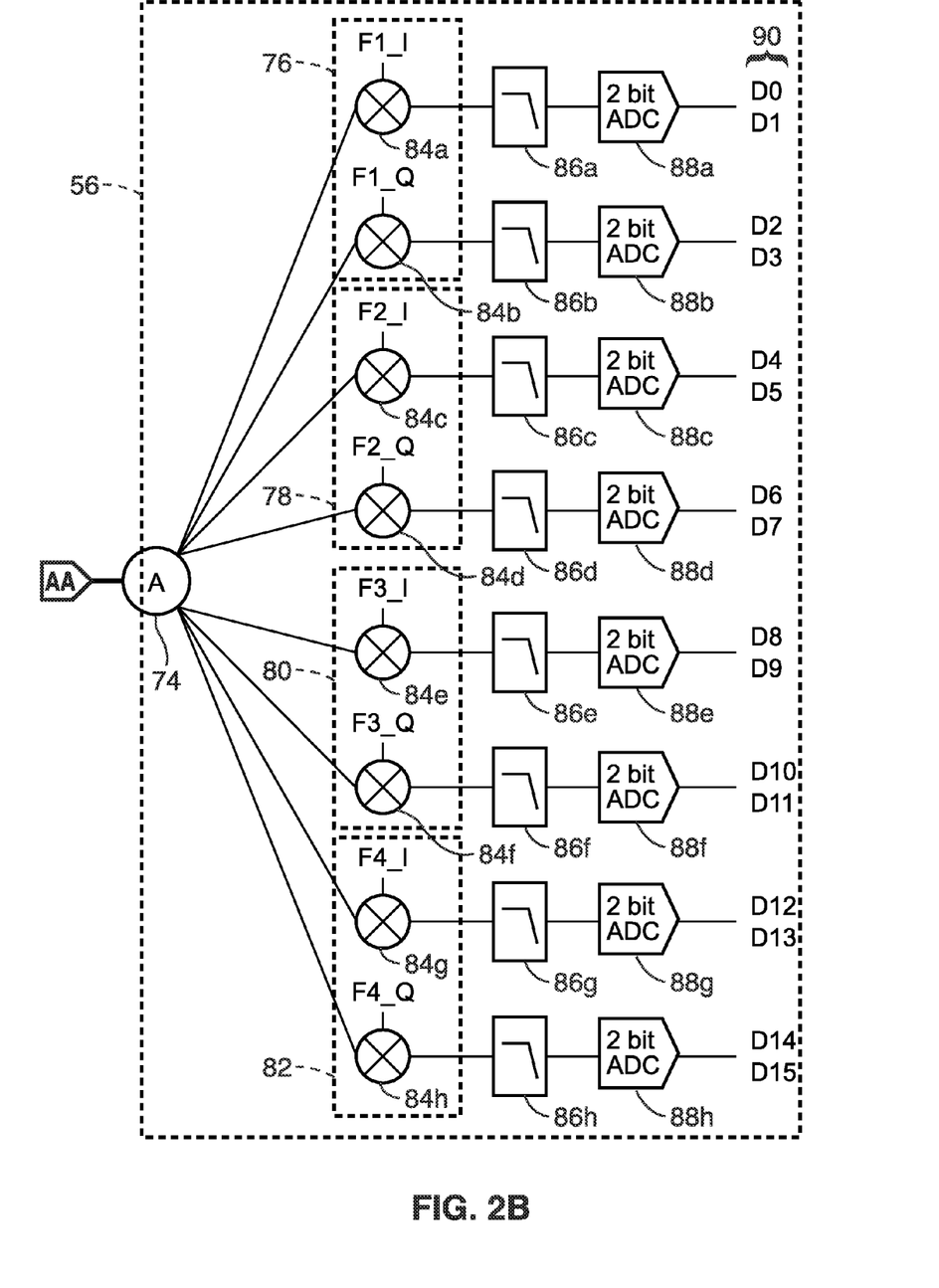

FIG. 2A and FIG. 2B illustrate an example embodiment 50 of a serializer de-serializer in which the communications bandwidth from a first chip 52 in FIG. 2A to a second chip 56 in FIG. 2B over I/O channel 54 is increased by utilizing additional frequency bands. It will be seen that the following expands on the circuit shown in FIG. 1, from 8 data bits to 16 data bits.

A 16 bit parallel input 58 is shown in FIG. 2A with bits D0 through D15, grouped with pairs of bits (i.e., D0 and D1, D2 and D3, D4 and D5, . . . , D14 and D15), with each pair of bits received by two bit digital-to-analog converters (DACs) 60a, 60b, 60c, . . . , 60d. Each analog output from the DACs (60a, 60b, 60c, . . . , 60d) is coupled to QAM mixer inputs (Q and I inputs for each QAM). In particular, output from DAC 60a is coupled to mixer 62a which also receives a 90 degree out-of-phase modulation carrier F1_I, while the output from DAC 60b is coupled to mixer 62b which also receives a 90 degree out-of-phase modulation carrier F1_Q. Mixers 22a, 22b are both associated with QAM modulator 64. In a similar manner outputs from DACs 60c, 60d are coupled to mixers 62c, 62d, which also receives 90 degree out-of-phase modulation carrier F2_I, F2_Q, respectively. Mixers 62c, 62d are both associated with QAM modulator 66.

In like manner, QAM modulator 68 has mixers 62e, 62f which also receive out-of-phase modulation carriers F3_I, F3_Q, respectively, while QAM modulator 70 has mixers 62g, 62h and uses 90 degree out-of-phase modulation carriers F4_I, F4_Q, respectively.

Output from the mixers of QAM modulators 64, 66, 68, 70 are summed at adder 72 and output over I/O connection 54 from first chip 52 to second chip 56. Through this modulation process, the 16 bit parallel input is thus serialized into a series output as an analog signal.

The analog signal over I/O connection 54 is preferably received by an amplifier 74 in FIG. 2B which provides a gain stage to compensate for loss in a subsequent low pass filter. Amplified signal 54 is coupled to mixers 84a, 84b, 84c, . . . , 84h, along with 90 degree out-of-phase modulation carriers F1_I, F1_Q, F2_I, F2_Q, F3_I, F3_Q, F4_I, F4_Q respectively, in QAM demodulators 76, 78, 80, 82. The eight analog outputs from these QAM demodulators are then filtered through low pass filters 86a, 86b, 86c, . . . , 86h, before receipt by two-bit analog-to-digital converters (ADC) 88a, 88b, 88c, . . . , 88h. Data 90 from the eight pairs of bits is output from the ADCs. Through this demodulation process, the analog serial input is thus de-serialized back to an output of the original parallel output of 16 digital data bits.

Figure 3:
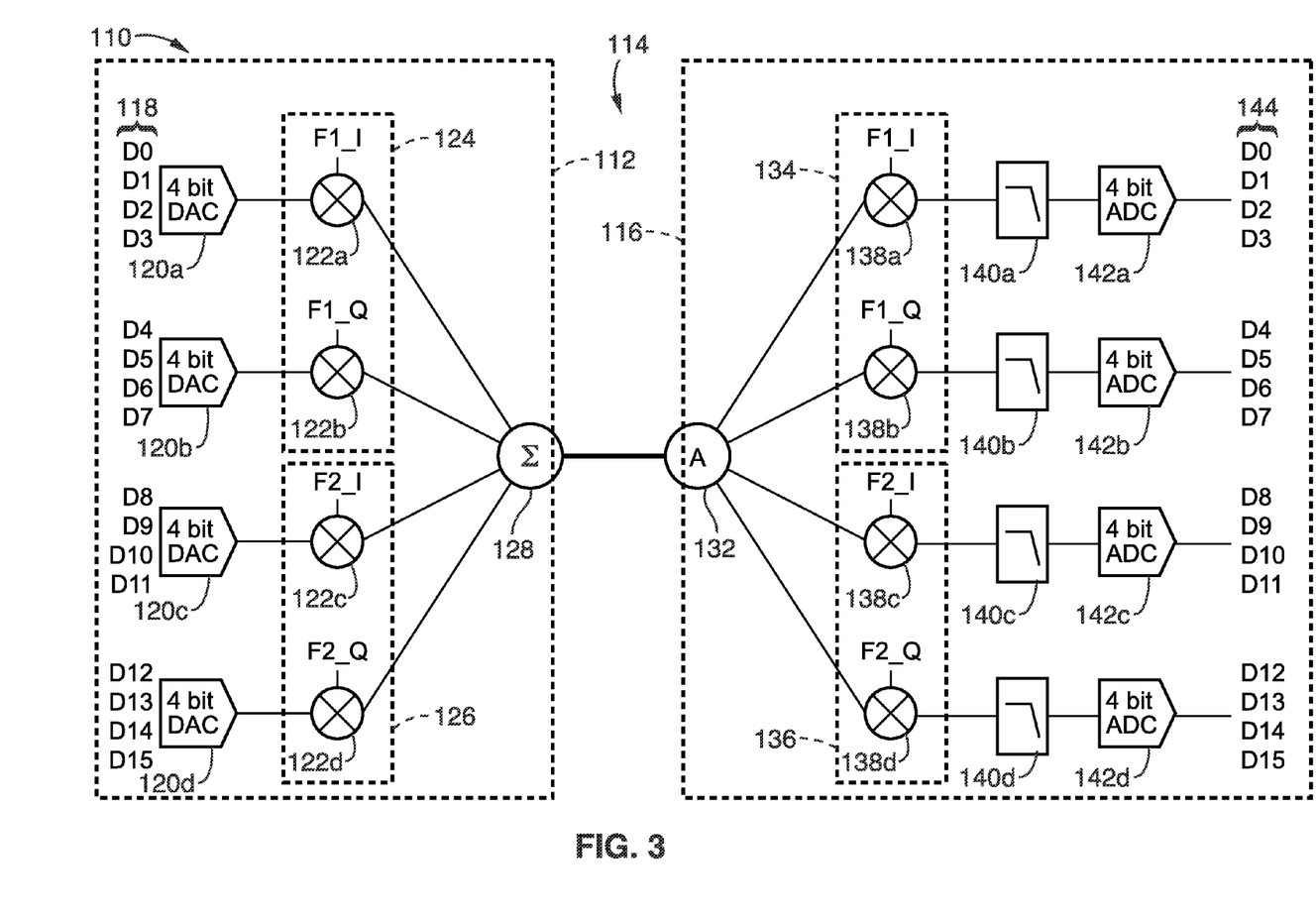
FIG. 3 is a schematic of a dual frequency QAM 256 serializer and de-serializer according to an embodiment of the present invention, shown for communicating 16 bits of digital data from a first chip to a second chip.

FIG. 3 illustrates an example embodiment 110 of a serializer de-serializer in which bandwidth is increased, between a first chip 112 over an I/O connect 114 to a second chip 116, by using a higher order QAM. It should be appreciated that a variety of forms of QAM are available and can be utilized with the present invention, some of the more common forms that can be selected for use include: QAM8, QAM16, QAM32, QAM64, QAM128, and QAM256. It will be appreciated that QAM distributes information in the I-Q plane evenly, and the higher orders of QAM involve information spaced more closely in the constellation. Thus, higher order QAM allows transmitting more bits per symbol, but if the energy of the constellation is to remain the same, the points on the constellation are closer together and the transmission becomes more susceptible to noise. It should also be appreciated that modulation and demodulation can be performed according to the present invention utilizing other forms of multi-frequency analog modulation-demodulation. Examples of other forms of multi-frequency modulation which can be utilized include pulse-width modulation (PWM), frequency-shift keying (FSK), frequency-hopping, spread spectrum, and so forth.

Parallel digital data input of 16 bits 118 parallel is seen with bits D0 through D15, grouped in nibbles (i.e., 4 bits) (i.e., D0-D3, D4-D7, D8-D11, D12-D15), with each nibble of bits received by four bit digital-to-analog converters (DACs) 120a, 120b, 120c and 120d. Each analog output from the DACs (120a, 120b, 120c and 120d) is coupled to QAM mixers. In particular, output from DAC 120a is coupled to mixer 122a which also receives a 90 degree out-of-phase modulation carrier F1_I, while the output from DAC 120b is coupled to mixer 122b, along with a 90 degree out-of-phase modulation carrier F1_Q. Mixers 122a, 122b are both associated with QAM modulator 124. Similarly, outputs from DACs 120c, 120d are coupled to mixers 122c, 122d, respectively, which also receive 90 degree out-of-phase modulation carriers F2_I, F2_Q. Mixers 122c, 122d are both associated with QAM modulator 126. Outputs from the mixers of both QAM modulators 124, 126 are summed at adder 128 and output over I/O connection 114 from first chip 112 to second chip 116. Utilizing this inventive modulation process, the parallel digital input is thus serialized into a series output as an analog signal.

The analog signal over I/O connection 114 is preferably received by an amplifier 132 which provides a gain stage to compensate for loss in the low pass filter. Amplified signal 114 is coupled to mixers 138a, 138b in a first QAM demodulator 134, which receives 90 degree out-of-phase modulation carriers F1_I, F1_Q, respectively. In a second QAM demodulator 136, mixers 138c, 138d receive the amplified signal as well as 90 degree out-of-phase modulation carriers F2_I, F2_Q. Four analog signal channels are output from mixers 138a, 138b, 138c, 138d to low pass filters 140a, 140b, 140c and 140d, before receipt by four-bit analog-to-digital converters (ADCs) 142a, 142b, 142c and 142d. Data 144 comprising the nibbles from the ADCs is output as parallel digital data shown here with the 16 bits. Thus, it has been shown in FIG. 3 that the original 16 bits of digital data was serialized, communicated off-chip, de-serialized and converted back to 16 bits of parallel digital data.

The examples above in FIG. 2 and FIG. 3 demonstrate that the present invention can be scaled to a desired number of bits by utilizing more frequency channels of QAM, or higher order QAM encoding, or a combination of more QAM frequency channels and higher order QAM encoding. It should also be appreciated that other multi-frequency analog modulation techniques can be utilized in place of QAM without departing from the invention (e.g., pulse-width modulation (PWM), frequency-shift keying (FSK), frequency-hopping, spread-spectrum, and so forth). The above example circuits can be implemented in any device technology, and are particularly well-suited for use in advanced silicon process technology, such as at or below 28 nm.

The unique multi frequency (or band) serializer and de-serializer of the present invention provide numerous advantages over existing technology. In particular, this new paradigm breaks through silicon process limitations of requiring advanced process nodes, or large numbers of nodes, to increase the bandwidth. Using any given device process, the proposed scheme can increase data transfer bandwidth by using combined frequency bands and QAM modulations. The added circuit overhead becomes relatively insignificant as CMOS technology is further scaled. In the advanced system-on-chip (SoC) designs, large numbers of I/O connections can be reduced by at least a factor of five (×5) by applying the teachings of the present invention while maintaining the same bandwidth.

Another option is to keep the same I/O number but increase bandwidth by the same factor (e.g., ×5), since I/O number does not scale down as process technology advances. Of course a combination approach can be wrought with the present invention, thus providing over a two fold increase in bandwidth and over a twofold reduction in the number of I/Os. This innovative I/O circuit scheme not only improves chip-to-chip I/O performance but also reduces manufacturing cost.

From the discussion above it will be appreciated that the invention can be embodied in various ways, including the following:

1. An apparatus for serializing and de-serializing chip-to-chip communications, comprising: a serializer configured for integration within a first integrated circuit chip, comprising: multiple digital-to-analog converters (DACs) configured for converting N parallel bits of digital data to M analog signals, wherein N is an integer value which is at least two times larger than M; one or more mixers at each of multiple frequencies configured for performing analog modulation; wherein each said mixer receives one of said M analog signals and a modulation carrier; and an adder configured for summing outputs from each of said multiple mixers at said multiple frequencies into an I/O output; a de-serializer configured for integration within a second integrated circuit chip, comprising: an amplifier configured for amplifying said I/O output from said serializer; one or more mixers at each of multiple frequencies configured for performing analog demodulation; wherein each said mixer receives said I/O output from said serializer containing said M analog signals, and a modulation carrier; a low pass filter coupled to an output of each said mixer; multiple digital-to-analog converters (DACs), each said DAC receiving input from each said low pass filter, and outputting digital data bits; and wherein a given number of parallel digital data bits are converted to a serial analog signal, configured for communication over a single I/O line by the serializer to a de-serializer in a second chip which de-serializes the analog information back into the original parallel digital data bits.

2. The apparatus of any of the previous embodiments, wherein said digital-to-analog and analog-to-digital converters operate with at least two bits.

3. The apparatus of any of the previous embodiments, wherein said multiple frequencies comprises at least a first frequency and a second frequency.

4. The apparatus of any of the previous embodiments, wherein said multiple frequencies comprises at least four frequencies.

5. The apparatus of any of the previous embodiments, wherein said analog modulation and demodulation is performed by a modulator or demodulator utilizing quadrature amplitude modulation (QAM); wherein said modulation carrier comprises a 90 degree out-of-phase modulation carrier; and wherein each of said modulator or demodulator utilizing QAM has two of said mixers for a Q and an I channel.

6. The apparatus of any of the previous embodiments, wherein said quadrature amplitude modulation (QAM) is selected from the group of QAM orders consisting of QAM8, QAM16, QAM32, QAM64, QAM128 or QAM256.

7. The apparatus of any of the previous embodiments, wherein said N parallel bits comprises at least 8 bits.

8. An apparatus for serializing and de-serializing chip-to-chip communications, comprising: a serializer configured for integration within a first integrated circuit chip, comprising: multiple digital-to-analog converters (DACs) in said serializer, wherein said DACs convert N parallel bits of digital data to M analog signals, wherein N is an integer value which is at least two times larger than M; two mixers at each of multiple frequencies configured for quadrature amplitude modulation (QAM); wherein each said mixer receives one of said M analog signals, and a 90 degree out-of-phase modulation carrier; and an adder configured for summing outputs from each of said multiple mixers at said multiple frequencies into an I/O output; a de-serializer configured for integration within a second integrated circuit chip, comprising: an amplifier configured for amplifying said I/O output from said serializer; two mixers at each of multiple frequencies configured for quadrature amplitude demodulation (QAM); wherein each said mixer receives said I/O output from said serializer containing said M analog signals, and a 90 degree out-of-phase modulation carrier; a low pass filter coupled to an output of each said mixer; multiple digital-to-analog converters (DACs), each said DAC receiving input from each said low pass filter, and outputting digital data bits; and wherein a given number of parallel digital data bits are converted to a serial analog signal, configured for communication over a single I/O line by the serializer to a de-serializer in a second chip which de-serializes the analog information back into the original parallel digital data bits.

9. The apparatus of any of the previous embodiments, wherein said digital-to-analog and analog-to-digital converters operate with two or four bits.

10. The apparatus of any of the previous embodiments, wherein said multiple frequencies comprises at least a first frequency and a second frequency.

11. The apparatus of any of the previous embodiments, wherein said multiple frequencies comprises at least four frequencies.

12. The apparatus of any of the previous embodiments, wherein said quadrature amplitude modulation (QAM) is selected from the group of QAM orders consisting of QAM8, QAM16, QAM32, QAM64, QAM128 or QAM256.

13. The apparatus of any of the previous embodiments, wherein said quadrature amplitude modulation (QAM) encodes two analog message signals into carrier waves at each output frequency.

14. The apparatus of any of the previous embodiments, wherein said N parallel bits comprises at least 8 bits.

15. A serializer apparatus for chip-to-chip communications, comprising: multiple digital-to-analog converters (DACs) in said serializer apparatus, wherein said DACs convert N parallel bits of digital data to M analog signals, wherein N is an integer value which is at least two times larger than M; two mixers at each of multiple frequencies configured for quadrature amplitude modulation (QAM); wherein each said mixer receives one of said M analog signals, and a 90 degree out-of-phase modulation carrier; and an adder configured for summing outputs from each of said multiple mixers at said multiple frequencies into an I/O output configured for connection to a de-serializer for converting the serial analog I/O output signal back into N parallel bits of digital data.

16. The apparatus of any of the previous embodiments, wherein said digital-to-analog and analog-to-digital converters operate with two or four bits.

17. The apparatus of any of the previous embodiments, wherein said multiple frequencies comprise at least a first frequency and a second frequency.

18. The apparatus of any of the previous embodiments, wherein said multiple frequencies comprise at least four frequencies.

19. The apparatus of any of the previous embodiments, wherein said quadrature amplitude modulation (QAM) is selected from the group of QAM orders consisting of QAM8, QAM16, QAM32, QAM64, QAM128 or QAM256.

20. The apparatus of any of the previous embodiments, wherein said quadrature amplitude modulation (QAM) encodes two analog message signals into carrier waves at each output frequency.

21. The apparatus of any of the previous embodiments, wherein said N parallel bits comprises at least 8 bits.

22. A de-serializer apparatus for chip-to-chip communications, comprising: an amplifier configured for receiving and amplifying a serial analog I/O signal in which N parallel bits of digital data are contained within M analog signals; wherein N is an integer value which is at least two times larger than M; two mixers at each of multiple frequencies configured for quadrature amplitude demodulation (QAM); wherein each said mixer receives said serial analog I/O signal containing M analog signals, and a 90 degree out-of-phase modulation carrier; a low pass filter coupled to an output of each said mixer; and multiple digital-to-analog converters (DACs), each said DAC receiving input from each said low pass filter, and outputting digital data as N parallel bits from said M analog signals.

23. The apparatus of any of the previous embodiments, wherein said N parallel bits comprises at least 8 bits, and wherein said digital-to-analog and analog-to-digital converters operate with two or four bits.

24. The apparatus of any of the previous embodiments, wherein said multiple frequencies comprises at least a first frequency and a second frequency.

25. The apparatus of any of the previous embodiments, wherein said multiple frequencies comprise at least four frequencies.

26. The apparatus of any of the previous embodiments, wherein said quadrature amplitude modulation (QAM) is selected from the group of QAM orders consisting of QAM8, QAM16, QAM32, QAM64, QAM128 or QAM256.

27. The apparatus of any of the previous embodiments, wherein said quadrature amplitude modulation (QAM) encodes two analog message signals into carrier waves at each output frequency.

Although the description herein contains many details, these should not be construed as limiting the scope of the disclosure but as merely providing illustrations of some of the presently preferred embodiments. Therefore, it will be appreciated that the scope of the disclosure fully encompasses other embodiments which may become obvious to those skilled in the art.

In the claims, reference to an element in the singular is not intended to mean "one and only one" unless explicitly so stated, but rather "one or more." All structural, chemical, and functional equivalents to the elements of the disclosed embodiments that are known to those of ordinary skill in the art are expressly incorporated herein by reference and are intended to be encompassed by the present claims. Furthermore, no element, component, or method step in the present disclosure is intended to be dedicated to the public regardless of whether the element, component, or method step is explicitly recited in the claims. No claim element herein is to be construed as a "means plus function" element unless the element is expressly recited using the phrase "means for". No claim element herein is to be construed as a "step plus function" element unless the element is expressly recited using the phrase "step for".

What is claimed is:

1. An apparatus for serializing and de-serializing chip-to-chip communications, comprising:
   (a) a serializer configured for integration within a first integrated circuit chip, comprising:
      (i) multiple digital-to-analog converters (DACs) configured for converting N parallel bits of digital data to M analog signals, wherein N is an integer value which is at least two times larger than M;
      (ii) one or more mixers at each of multiple frequencies configured for performing analog modulation;
      (iii) wherein each said mixer receives one of said M analog signals and a modulation carrier; and
      (iv) an adder configured for summing outputs from each of said multiple mixers at said multiple frequencies into an I/O output; and
   (b) a de-serializer configured for integration within a second integrated circuit chip, comprising:
      (i) an amplifier configured for amplifying said I/O output from said serializer;
      (ii) one or more mixers at each of multiple frequencies configured for performing analog demodulation;
      (iii) wherein each said mixer receives said I/O output from said serializer containing said M analog signals, and a modulation carrier;
      (iv) a low pass filter coupled to an output of each said mixer; and
      (v) multiple digital-to-analog converters (DACs), each said DAC receiving input from each said low pass filter, and outputting digital data bits;
   (c) wherein a given number of parallel digital data bits are converted to a serial analog signal, configured for communication over a single I/O line by the serializer to a de-serializer in a second chip which de-serializes the analog information back into the original parallel digital data bits.

2. The apparatus recited in claim 1, wherein said digital-to-analog converters operate with two or four bits.

3. The apparatus recited in claim 1, wherein said multiple frequencies comprise at least a first frequency and a second frequency.

4. The apparatus recited in claim 1, wherein said multiple frequencies comprise at least four frequencies.

5. The apparatus recited in claim 1:
   wherein said analog modulation and demodulation is performed by a modulator or demodulator utilizing quadrature amplitude modulation (QAM);
   wherein said modulation carrier comprises a 90 degree out-of-phase modulation carrier; and
   wherein each of said modulator or demodulator utilizing QAM has two of said mixers for a Q and an I channel.

6. The apparatus recited in claim 5, wherein said quadrature amplitude modulation (QAM) is selected from the group of QAM orders consisting of QAM8, QAM16, QAM32, QAM64, QAM128 or QAM256.

7. The apparatus recited in claim 1, wherein said N parallel bits comprise at least 8 bits.

8. An apparatus for serializing and de-serializing chip-to-chip communications, comprising:
   (a) a serializer configured for integration within a first integrated circuit chip, comprising:
      (i) multiple digital-to-analog converters (DACs) in said serializer, wherein said DACs convert N parallel bits of digital data to M analog signals, wherein N is an integer value which is at least two times larger than M;
      (ii) two mixers at each of multiple frequencies configured for performing quadrature amplitude modulation (QAM);
      (iii) wherein each said mixer receives one of said M analog signals, and a 90 degree out-of-phase modulation carrier; and
      (iv) an adder configured for summing outputs from each of said multiple mixers at said multiple frequencies into an I/O output; and
   (b) a de-serializer configured for integration within a second integrated circuit chip, comprising:
      (i) an amplifier configured for amplifying said I/O output from said serializer;
      (ii) two mixers at each of multiple frequencies configured for quadrature amplitude demodulation (QAM);
      (iii) wherein each said mixer receives said I/O output from said serializer containing said M analog signals, and a 90 degree out-of-phase modulation carrier;
      (iv) a low pass filter coupled to an output of each said mixer; and
      (v) multiple digital-to-analog converters (DACs), each said DAC receiving input from each said low pass filter, and outputting digital data bits;
   (c) wherein a given number of parallel digital data bits are converted to a serial analog signal, configured for communication over a single I/O line by the serializer to a de-serializer in a second chip which de-serializes the analog information back into the original parallel digital data bits.

9. The apparatus recited in claim 8, wherein said digital-to-analog converters operate with two or four bits.

10. The apparatus recited in claim 8, wherein said multiple frequencies comprise at least a first frequency and a second frequency.

11. The apparatus recited in claim 8, wherein said multiple frequencies comprise at least four frequencies.

12. The apparatus recited in claim 8, wherein said quadrature amplitude modulation (QAM) is selected from the group of QAM orders consisting of QAM8, QAM16, QAM32, QAM64, QAM128 or QAM256.

13. The apparatus recited in claim 8, wherein said quadrature amplitude modulation (QAM) encodes two analog message signals into carrier waves at each output frequency.

14. The apparatus recited in claim 8, wherein said N parallel bits comprise at least 8 bits.

15. A serializer apparatus for chip-to-chip communications, comprising:
   multiple digital-to-analog converters (DACs) in said serializer apparatus, wherein said DACs convert N parallel bits of digital data to M analog signals, wherein N is an integer value which is at least two times larger than M;

two mixers at each of multiple frequencies configured for quadrature amplitude modulation (QAM) which encodes two analog message signals into carrier waves at each output frequency;

wherein each said mixer receives one of said M analog signals, and a 90 degree out-of-phase modulation carrier; and an adder configured for summing outputs from each of said multiple mixers at said multiple frequencies into an I/O output configured for connection to a de-serializer for converting the serial analog I/O output signal back into N parallel bits of digital data.

16. The apparatus recited in claim 15, wherein said digital-to-analog converters operate with two or four bits.

17. The apparatus recited in claim 15, wherein said multiple frequencies comprise at least a first frequency and a second frequency.

18. The apparatus recited in claim 15, wherein said multiple frequencies comprise at least four frequencies.

19. The apparatus recited in claim 15, wherein said quadrature amplitude modulation (QAM) is selected from the group of QAM orders consisting of QAM8, QAM16, QAM32, QAM64, QAM128 or QAM256.

20. The apparatus recited in claim 15, wherein said N parallel bits comprise at least 8 bits.

21. A de-serializer apparatus for chip-to-chip communications, comprising:

an amplifier configured for receiving and amplifying a serial analog I/O signal in which N parallel bits of digital data are contained within M analog signals;

wherein N is an integer value which is at least two times larger than M;

two mixers at each of multiple frequencies configured for quadrature amplitude demodulation (QAM);

wherein each said mixer receives said serial analog I/O signal containing M analog signals, and a 90 degree out-of-phase modulation carrier;

a low pass filter coupled to an output of each said mixer; and multiple digital-to-analog converters (DACs), each said DAC receiving input from each said low pass filter, and outputting digital data as N parallel bits from said M analog signals.

22. The apparatus recited in claim 21, wherein said N parallel bits comprise at least 8 bits, and wherein said digital-to-analog converters operate with two or four bits.

23. The apparatus recited in claim 21, wherein said multiple frequencies comprise at least a first frequency and a second frequency.

24. The apparatus recited in claim 21, wherein said multiple frequencies comprise at least four frequencies.

25. The apparatus recited in claim 21, wherein said quadrature amplitude modulation (QAM) is selected from the group of QAM orders consisting of QAM8, QAM16, QAM32, QAM64, QAM128 or QAM256.

26. The apparatus recited in claim 21, wherein said quadrature amplitude modulation (QAM) encodes two analog message signals into carrier waves at each output frequency.

27. A serializer apparatus for chip-to-chip communications, comprising:

multiple digital-to-analog converters (DACs) in said serializer apparatus, wherein said DACs convert N parallel bits of digital data to M analog signals, wherein N is an integer value which is at least two times larger than M;

two mixers at each of multiple frequencies configured for quadrature amplitude modulation (QAM), wherein said quadrature amplitude modulation (QAM) is selected from the group of QAM orders consisting of QAM8, QAM16, QAM32, QAM64, QAM128 or QAM256;

wherein each said mixer receives one of said M analog signals, and a 90 degree out-of-phase modulation carrier; and an adder configured for summing outputs from each of said multiple mixers at said multiple frequencies into an I/O output configured for connection to a de-serializer for converting the serial analog I/O output signal back into N parallel bits of digital data.

28. The apparatus recited in claim 27, wherein said digital-to-analog converters operate with two or four bits.

29. The apparatus recited in claim 27, wherein said multiple frequencies comprise at least a first frequency and a second frequency.

30. The apparatus recited in claim 27, wherein said multiple frequencies comprise at least four frequencies.

31. The apparatus recited in claim 27, wherein said quadrature amplitude modulation (QAM) encodes two analog message signals into carrier waves at each output frequency.

32. The apparatus recited in claim 27, wherein said N parallel bits comprise at least 8 bits.

* * * * *